(12) United States Patent
Lin et al.

(10) Patent No.: US 12,727,079 B2
(45) Date of Patent: Sep. 1, 2026

(54) MEMBRANE CIRCUIT BOARD

(71) Applicant: CHICONY ELECTRONICS CO., LTD., New Taipei City (TW)

(72) Inventors: Chih-Hung Lin, New Taipei City (TW); Chih-Yi Lu, New Taipei City (TW)

(73) Assignee: CHICONY ELECTRONICS CO., LTD., New Taipei City (TW)

( * ) Notice: Subject to any disclaimer, the term of this patent is extended or adjusted under 35 U.S.C. 154(b) by 381 days.

(21) Appl. No.: 18/582,991

(22) Filed: Feb. 21, 2024

(65) Prior Publication Data

US 2025/0159797 A1 May 15, 2025

(30) Foreign Application Priority Data

Nov. 9, 2023 (TW) ................................ 112143296

(51) Int. Cl.
*H05K 1/02* (2006.01)
*H05K 3/46* (2006.01)

(52) U.S. Cl.
CPC ......... *H05K 1/0298* (2013.01); *H05K 3/4617* (2013.01); *H05K 2201/09036* (2013.01); *H05K 2203/0278* (2013.01)

(58) Field of Classification Search
CPC ............... H05K 1/0298; H05K 3/4617; H05K 2201/09036; H05K 2203/0278; H05K 1/111; H05K 2201/09945
USPC .......................................................... 174/261
See application file for complete search history.

(56) References Cited

U.S. PATENT DOCUMENTS 8,890,824 B2 11/2014 Guard

FOREIGN PATENT DOCUMENTS

TW 201339941 A 10/2013

*Primary Examiner* — Timothy J Thompson
*Assistant Examiner* — Sidi M Maiga
(74) *Attorney, Agent, or Firm* — MUNCY, GEISSLER, OLDS & LOWE, P.C.

(57) ABSTRACT

A membrane circuit board includes a first substrate, a second substrate, a space layer and a conductive adhesive. The first substrate includes a plurality of first butting circuits and at least one first transmission circuit. The first transmission circuit is connected to one of the first butting circuits. The second substrate includes a plurality of second butting circuits, each corresponding to one of the first butting circuits. The space layer is disposed between the first substrate and the second substrate. The space layer includes a butting opening and at least one first stress weakening portion. One end of the first stress weakening portion is connected to the butting opening, and the first stress weakening portion corresponds to the first transmission circuit. The conductive adhesive is disposed within the butting opening and is in contact with both the first butting circuits and the second butting circuits.

11 Claims, 11 Drawing Sheets

10c
12c
32
31
40
11c
21
13c
31
1c
10c
30
20

10c
30
12c
32
31
11c
40
8
21
13c
31
1c
10c
20

MEMBRANE CIRCUIT BOARD

CROSS-REFERENCE TO RELATED APPLICATION

This application claims the priority benefit of Taiwan application serial No. 112143296, filed on Nov. 9, 2023. The entirety of the above-mentioned patent application is hereby incorporated by reference herein and made a part of this specification.

BACKGROUND

1. Technical Field

The present disclosure relates to a membrane circuit board.

2. Description of the Related Art

With the advancement of technology, most electronic products are developed, lighter, thinner, shorter, and more compact designs are often preferred or required. For example, keyboards have transitioned from the early large structure to slim keyboards. Slim keyboards usually use multi-layer membrane circuit boards.

FIG. 1A illustrates a partial top view of a prior art membrane circuit board; FIG. 1B is a sectional schematic view along the A-A side of the membrane circuit board shown in FIG. 1A; and FIG. 1C is a schematic view of the membrane circuit board as shown in FIG. 1B being pressed together with a hot-pressing head. Please refer to FIG. 1A, FIG. 1B, and FIG. 1C. The multi-layer membrane circuit board 9 includes sequentially stacked an upper membrane 91, an intermediate space layer 92, and a lower membrane 93. The upper membrane 91 has an upper circuit 911, and the lower membrane 93 has a lower circuit 931. A portion of the upper circuit 911 and a portion of the lower circuit 931 are overlapped and can be butted. The intermediate space layer 92 has a butting opening 921, where the butted parts of the upper circuit 911 and the lower circuit 931 are located. Additionally, the conductive adhesive 94 is also disposed between the butted parts of the upper circuit 911 and the lower circuit, and the hot-pressing head 8 can press the upper circuit 911 and the lower circuit 931 together, as shown in FIG. 1B.

Due to the current trend of miniaturization in electronic products, the range in which the intermediate space layer 92 can form the butting opening 921 is very small. Taking a slim keyboard as an example, the intermediate space layer 92 also needs the structure holes for the hooks of the bottom plate to pass through, thereby compressing the area that can form the butting opening 921. However, if the area of the butting opening 921 is small, the extending parts (i.e., non-butted parts) of the upper circuit 911 or the lower circuit 931 may be affected by the downward pressure force of the hot-pressing head 8 and the shear force between the intermediate space layer 92, leading to fractures (indicated by arrow symbols in FIG. 1C). If there is a fracture in the upper circuit 911 or the lower circuit 931, the entire membrane circuit board 9 cannot be used, meaning a reduction in production yield, necessitating improvement.

SUMMARY

In view of the issue above, it is a primary object of the present disclosure to provide a membrane circuit board, which solves the problem of fracture in circuit of prior art membrane circuit boards due to compression, by incorporating a design with stress weakening portions.

To achieve the above objective, the present disclosure provides a membrane circuit board comprising a first substrate, a second substrate, a space layer, and a conductive adhesive. The first substrate comprises a plurality of first butting circuits and at least one first transmission circuit. The first transmission circuit is connected to one of the first butting circuits. The second substrate comprises a plurality of second butting circuits, each corresponding to one of the first butting circuits. The space layer is disposed between the first substrate and the second substrate. The space layer comprises a butting opening and at least one first stress weakening portion. One end of the first stress weakening portion is connected to the butting opening, and the first stress weakening portion corresponds to the first transmission circuit. The conductive adhesive is disposed within the butting opening and is in contact with both the first butting circuit and the second butting circuit.

According to an embodiment of the present disclosure, the membrane circuit board further comprises a compression reference region. The compression reference region is distributed within the butting opening, and the area of the compression reference region is greater than the area of one surface of the conductive adhesive.

According to an embodiment of the present disclosure, one end of the compression reference region is projected to a bottom surface of the first transmission circuit as a first projection point, and a bottom inner wall of the first stress weakening portion is projected to a top surface of the first transmission circuit as a second projection point. The slope of the line connecting the first and second projection points is less than or equal to 0.0245.

According to an embodiment of the present disclosure, the distance from one end of the compression reference region towards the first stress weakening portion to a bottom inner wall of the first stress weakening portion is greater than or equal to 1.25 mm.

According to an embodiment of the present disclosure, the first stress weakening portion is an opening extending outward from one end of the butting opening.

According to an embodiment of the present disclosure, the first stress weakening portion accommodates a portion of the conductive adhesive that is compressed.

According to an embodiment of the present disclosure, the first substrate comprises multiple first transmission circuits. The space layer comprises multiple first stress weakening portions. Each of the first stress weakening portions corresponds to one of the first transmission circuits.

According to an embodiment of the present disclosure, the first substrate comprises multiple first transmission circuits. The first stress weakening portion corresponds to the multiple first transmission circuits.

According to an embodiment of the present disclosure, the first substrate further comprises at least one second stress weakening portion, which is close to one end opposite to the first transmission circuit of the first butting circuits.

According to an embodiment of the present disclosure, the second stress weakening portion is an opening structure, creating a free end structure at one end adjacent to the first butting circuit.

According to an embodiment of the present disclosure, the second substrate further comprises at least one third stress weakening portion, which is adjacent to one end of the second butting circuit and corresponds to a portion of the first transmission circuit In continuation of the above, according to the membrane circuit board of the present disclosure, which comprises a first substrate, a second substrate, a space layer, and a conductive adhesive, the space layer is disposed between the first substrate and the second substrate. The conductive adhesive is disposed within the butting opening of the space layer and is in contact with the first butting circuit of the first substrate and the second butting circuit of the second substrate. By having the space layer with a first stress weakening portion, the first substrate with a second stress weakening portion, or the second substrate with a third stress weakening portion, the deformation of the first substrate and its first transmission circuit is enhanced. Therefore, when the hot-pressing head presses down on the first substrate, the structure of the aforementioned (first, second, or third) stress weakening portions increases the deformation of the first transmission circuit, thereby making the pressure on the first transmission circuit more uniform, achieving the effect of avoiding the fracture of the first transmission circuit during the compression process.

DETAILED DESCRIPTION OF THE EMBODIMENTS

In order to make the structure, characteristics, and effectiveness of the disclosure further understood and recognized, a detailed description of the disclosure is provided as follows, along with embodiments and accompanying figures.

Figure 2:
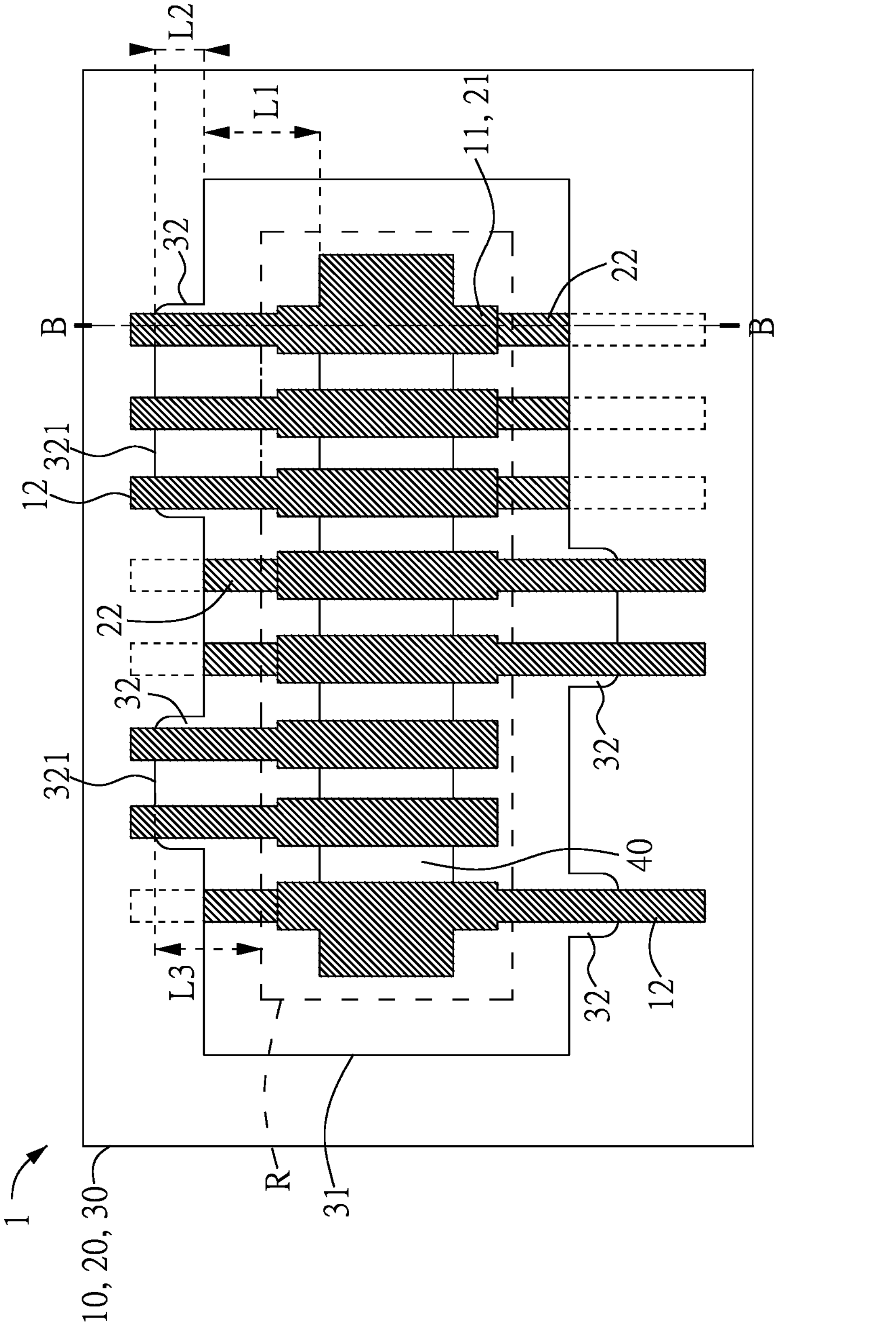
FIG. 2 is a partial top view of a membrane circuit board according to a first embodiment of the present disclosure.
Figure 3:
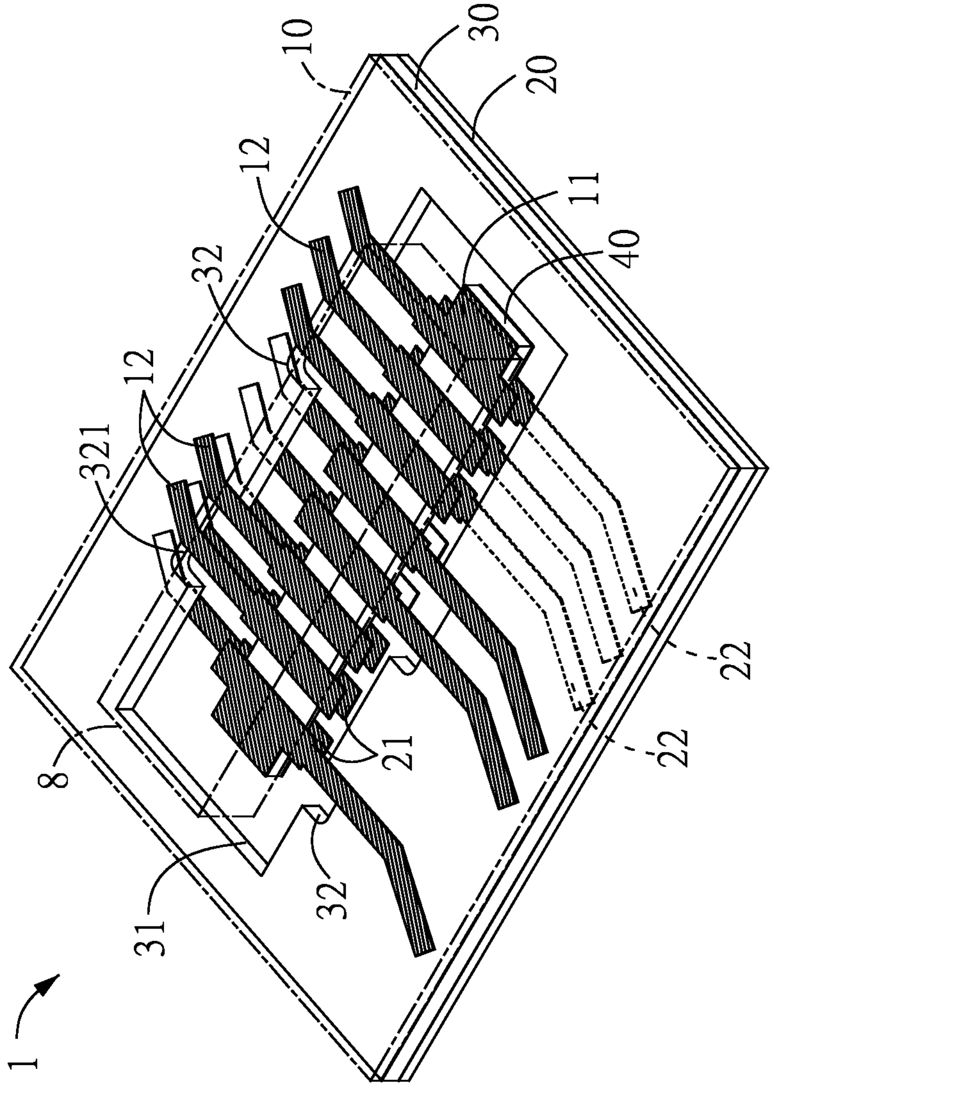
FIG. 3 is a perspective view of the membrane circuit board shown in FIG. 2 with a hot-pressing head.
Figure 4:
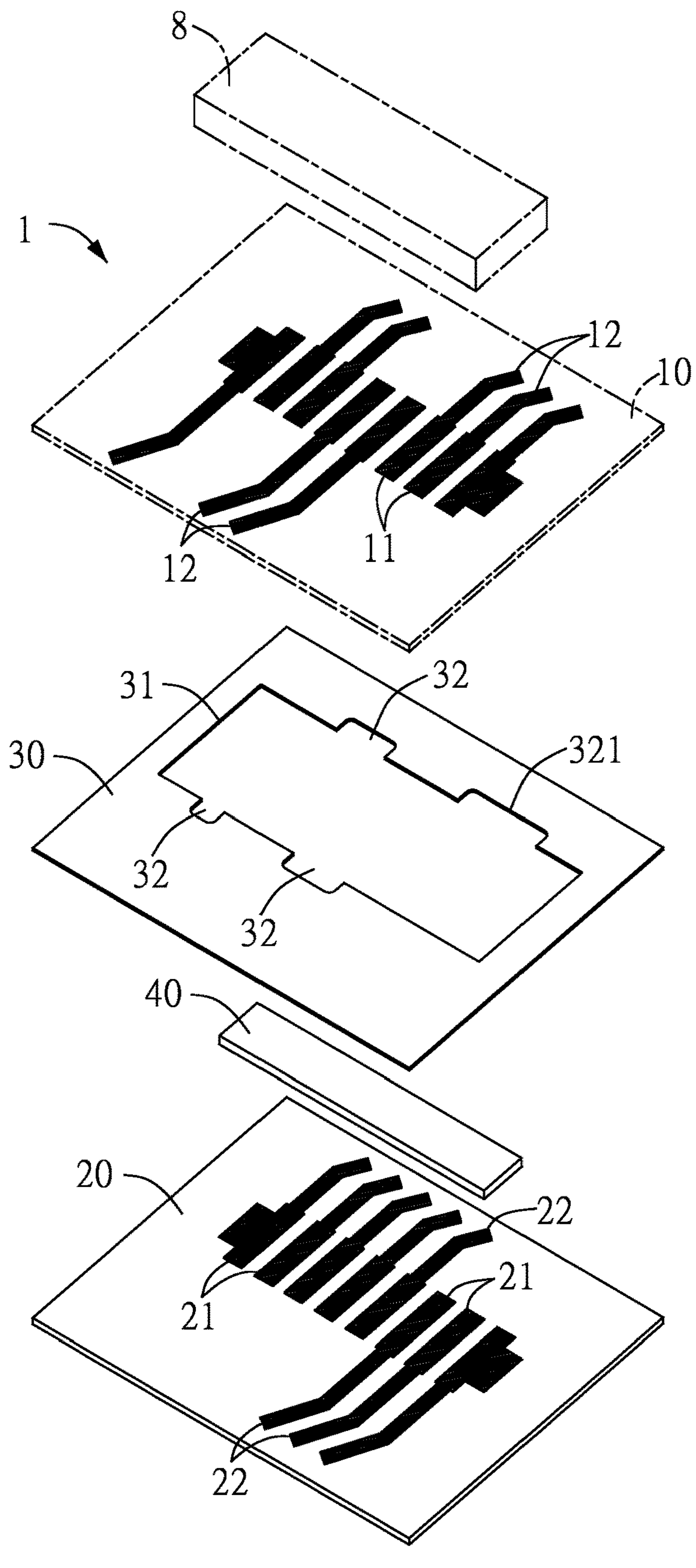
FIG. 4 is an exploded schematic view of the membrane circuit board and the hot-pressing head shown in FIG. 3.

FIG. 2 is a partial top view of a membrane circuit board according to a first embodiment of the present disclosure; FIG. 3 is a perspective view of the membrane circuit board shown in FIG. 2 with a hot-pressing head; and FIG. 4 is an exploded schematic view of the membrane circuit board and the hot-pressing head shown in FIG. 3. Please refer to FIG. 2, FIG. 3, and FIG. 4. The membrane circuit board 1 of this embodiment is a thin-film circuit board (or membrane switch circuit board) with a three-layer structure, comprising a first substrate 10, a second substrate 20, a space layer 30, and a conductive adhesive 40. The first substrate 10 is a membrane layer pressed by a hot-pressing head 8. Taking FIG. 4 as an example, the three-layer structure of the membrane circuit board 1 from top to bottom is the first substrate 10, the space layer 30, and the second substrate 20 in sequence. In other words, in this embodiment, the first substrate 10 is the upper membrane, and the second substrate 20 is the lower membrane. In other embodiments, the first substrate 10 and the second substrate 20 can also have the opposite configuration. It should be noted that because the first substrate 10, the second substrate 20, and the space layer 30 form a stacked three-layer structure, they are indicated at the same position in FIG. 2.

The first substrate 10 and the second substrate 20 each have conductive circuits (e.g., the circuits configured with silver paste) on their respective opposing surfaces. In this embodiment, the parts of circuits that can be overlapped and butted with each other are referred to as butting circuits, while the other extended parts are referred to as transmission circuits. Specifically, the first substrate 10 of this embodiment comprises a plurality of first butting circuits 11 and at least one first transmission circuit 12. In this embodiment, the first substrate 10 comprises a plurality of the first transmission circuits 12, and each of the first transmission circuits 12 is connected to one of the first butting circuits 11. In other words, parts of the first butting circuits 11 extends outward to form a first transmission circuit 12. Correspondingly, the second substrate 20 comprises a plurality of second butting circuits 21, each corresponding to the first butting circuits 11. Further, the second substrate 20 may comprise a plurality of second transmission circuits 22, each connected to one of the second butting circuits 21. It should be noted that the first butting circuits 11 and the first transmission circuits 12 are located on the lower surface of the first substrate 10, corresponding to the second substrate 20. To clearly depict the first butting circuits 11, the first transmission circuits 12, and other components located below the first substrate 10, the first substrate 10 in FIG. 2, FIG. 3, and FIG. 4 is represented by dashed lines. Additionally, because the first butting circuits 11 and the second butting circuits 21 overlap, they are marked at the same position in FIG. 2.

A space layer 30 is disposed between the first substrate 10 and the second substrate 20. The space layer 30 comprises a butting opening 31. The first butting circuits 11 and the second butting circuits 21 are located within the butting opening 31, corresponding to each other. As shown in FIG. 3 and FIG. 4, a conductive adhesive 40 is disposed between the first butting circuits 11 and the second butting circuits 21. In other words, the conductive adhesive 40 is also disposed within the butting opening 31 and contacts with the first butting circuits 11 and the second butting circuits 21, respectively. In this embodiment, the conductive adhesive 40 may be an anisotropic conductive film (ACF).

The space layer 30 further includes at least one first stress weakening portion 32. One end of the first stress weakening portion 32 is connected to the butting opening 31, and the first stress weakening portion 32 corresponds to the first transmission circuit 12. Specifically, the first stress weakening portion 32 may include, but is not limited to, a thinned groove or a hollow opening that provides deformation space for the first substrate 10 during compression. In this embodiment, the first stress weakening portion 32 is designed as a hollow opening. The position of the first stress weakening portion 32 corresponds to the first transmission circuit 12. More specifically, at the position corresponding to the first transmission circuit 12, the space layer 30 is hollowed out to form the first stress weakening portion 32. Further, one end of the first stress weakening portion 32 is connected to the butting opening 31, creating a communication opening between the butting opening 31 and the first stress weakening portion 32. In other words, the first stress weakening portion 32 is an opening extending outward from one end of the butting opening 31. In this embodiment, one first stress weakening portion 32 may correspond to multiple first transmission circuits 12. As shown in FIG. 2 and FIG. 3, one first stress weakening portion 32 may correspond to 2 or 3 adjacent first transmission circuits 12.

Figure 5A:
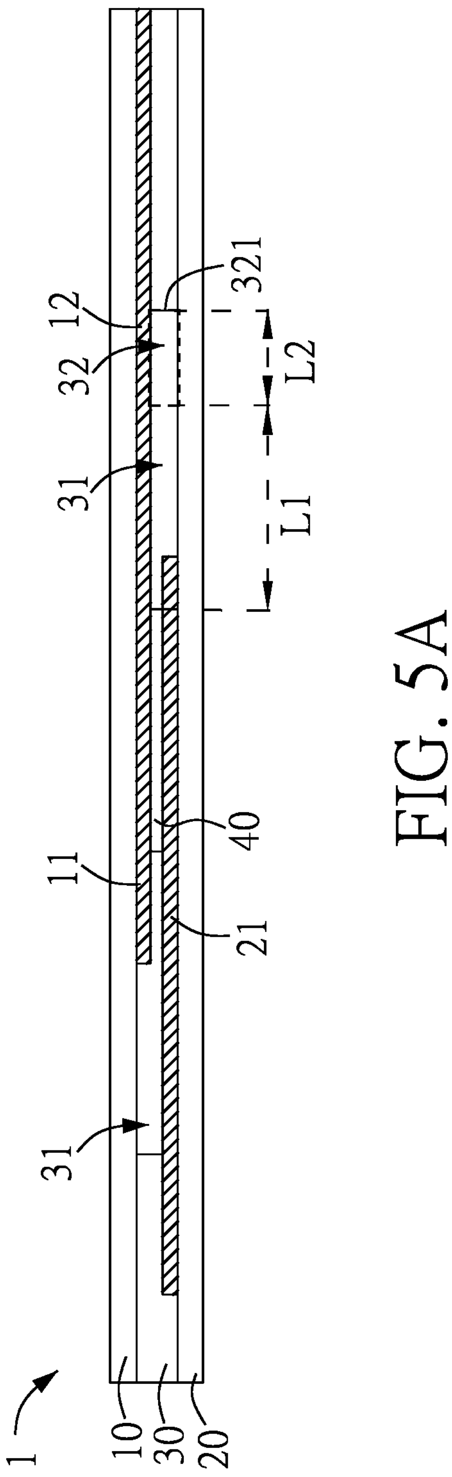
FIG. 5A is a sectional schematic view along the B-B side of the membrane circuit board shown in FIG. 2.
Figure 5B:
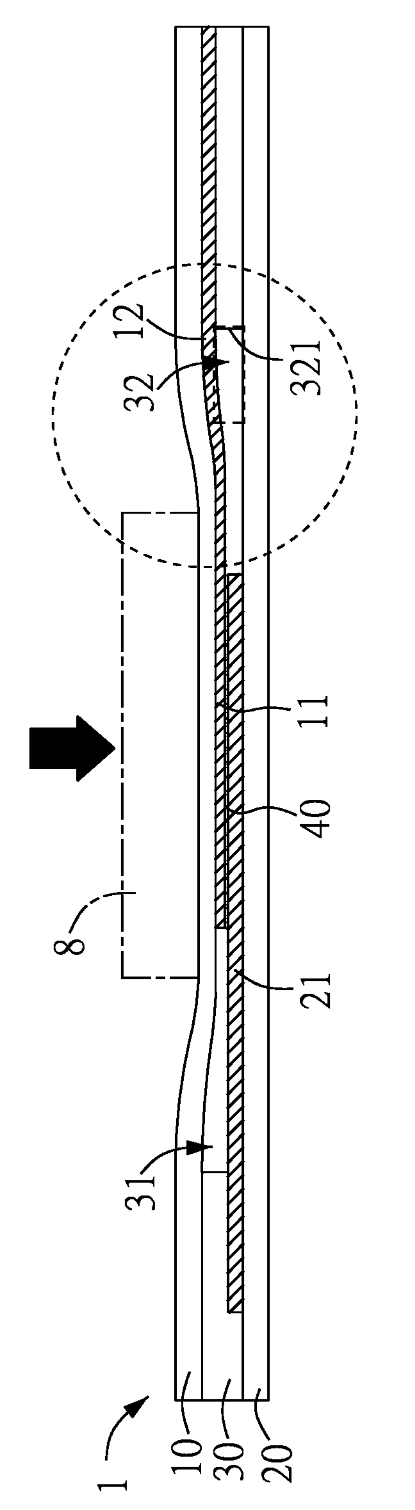
FIG. 5B is a schematic view of the membrane circuit board shown in FIG. 5A being pressed by the hot-pressing head.

FIG. 5A is a sectional schematic view along the B-B side of the membrane circuit board shown in FIG. 2; and FIG. 5B is a schematic view of the membrane circuit board shown in FIG. 5A being pressed by the hot-pressing head. Please refer to FIG. 2, FIG. 3, FIG. 5A, and FIG. 5B. When manufacturing the membrane circuit board 1, a hot-pressing head 8 is aligned with the position of the conductive adhesive 40 (which is also the position of the butting opening 31) to apply heat to the conductive adhesive 40. This process bonds the first substrate 10 and the second substrate 20, thereby establishing electrical connections between the first butting circuits 11 and the second butting circuits 21. For clarity, a virtual compression reference region R is defined in the membrane circuit board 1, as shown in FIG. 2. That is, the compression reference region R is located on the first substrate 10 or the second substrate 20 and is used for the hot-pressing head 8 to press. The compression reference region R is distributed within the butting opening 31, and the area of the compression reference region R is greater than the area of one surface of the conductive adhesive 40. Specifically, the area of the compression reference region R is smaller than the area of the butting opening 31, allowing the compression reference region R to be distributed within the butting opening 31. Moreover, the area of the compression reference region R is greater than the area of the surface of the conductive adhesive 40 facing the first substrate 10 or the second substrate 20, allowing the compression reference region R to fully cover the range of the conductive adhesive 40.

Figure 6:
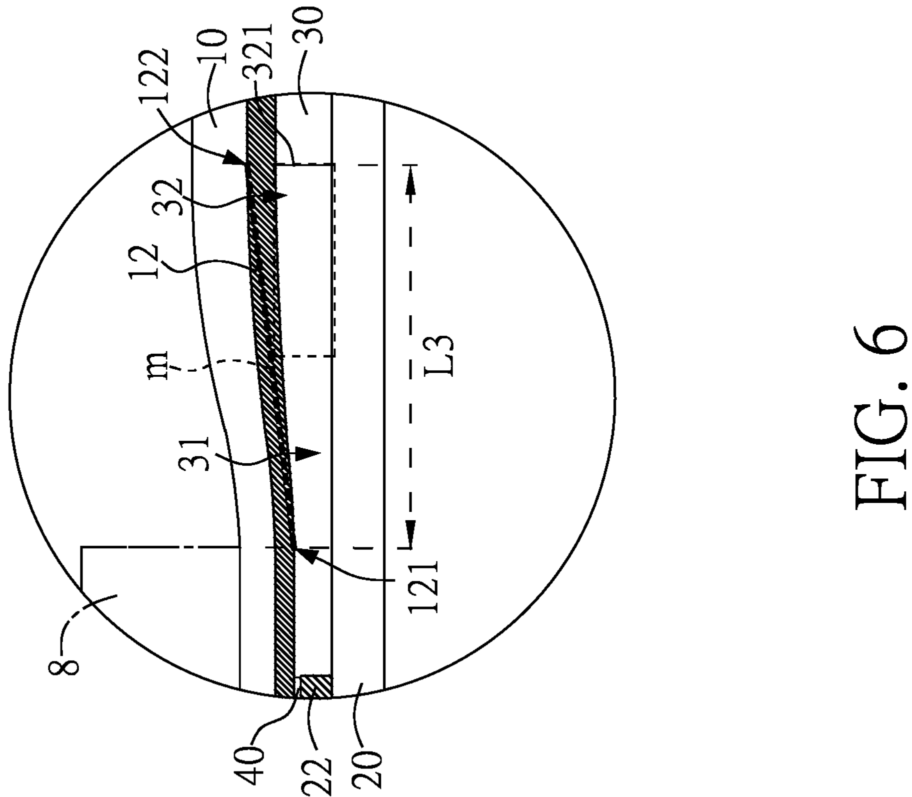
FIG. 6 is an enlarged view of region C in FIG. 5B.

When compressing the first substrate 10 and the second substrate 20, the hot-pressing head 8 corresponds to the compression reference region R, and the hot-pressing head 8 presses down from the upper surface of the first substrate 10, as shown in FIG. 5B. FIG. 6 is an enlarged view of region C shown in FIG. 5B, please refer to FIG. 2 and FIG. 6. Compared to the prior art, the placement of the first stress weakening portion 32 increases the space between the second butting circuits 21, the inner walls of the space layer 30, and the first transmission circuit 12. Therefore, when the hot-pressing head 8 compresses the first substrate 10, the first transmission circuit 12 can deform downward, evenly distributing the pressure on the first transmission circuit 12 and improving the issue of breakage during the compression of the first transmission circuit 12.

Figure 1A:
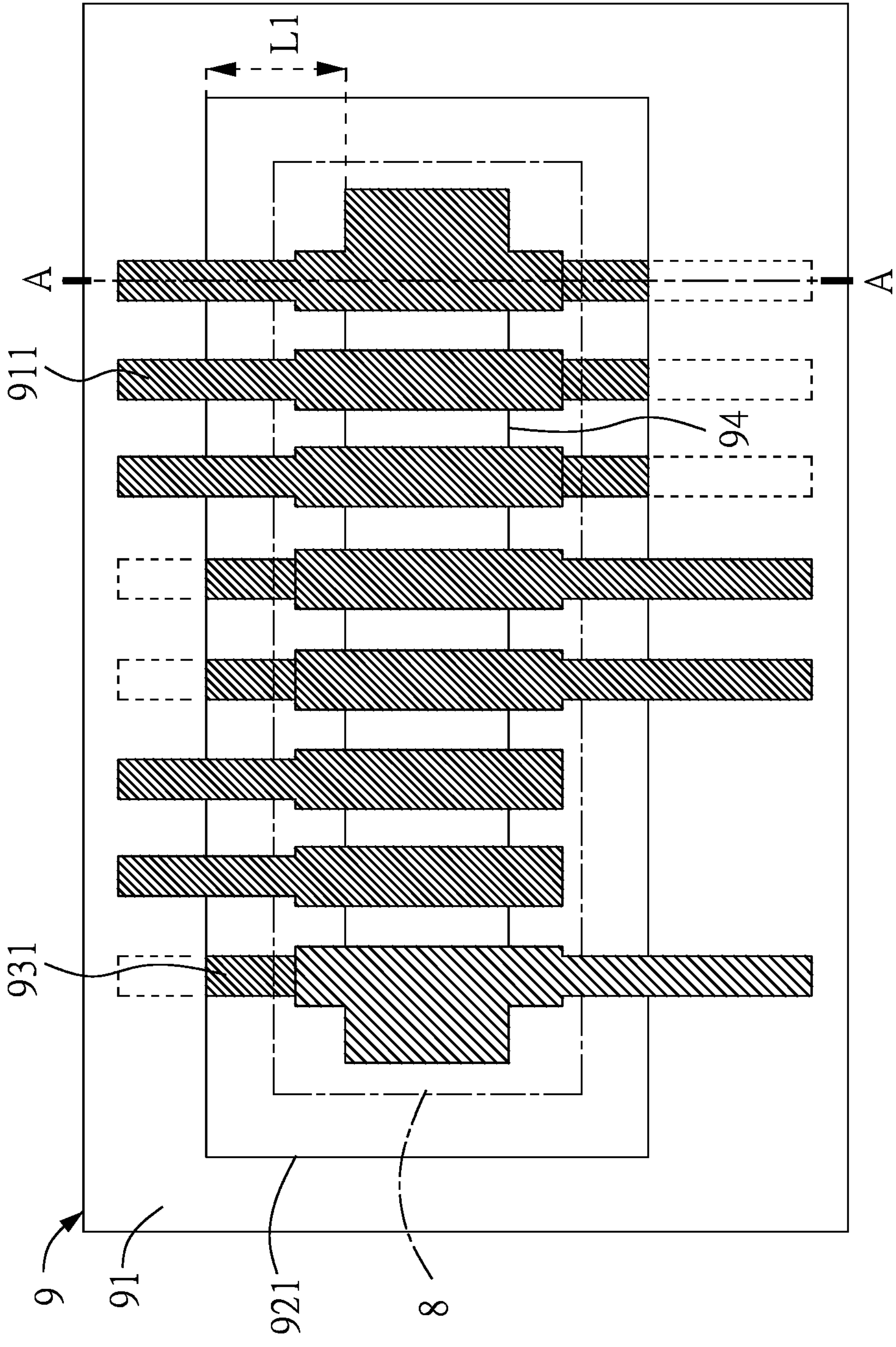
FIG. 1A illustrates a partial top view of a prior art membrane circuit board.
Figure 1B:
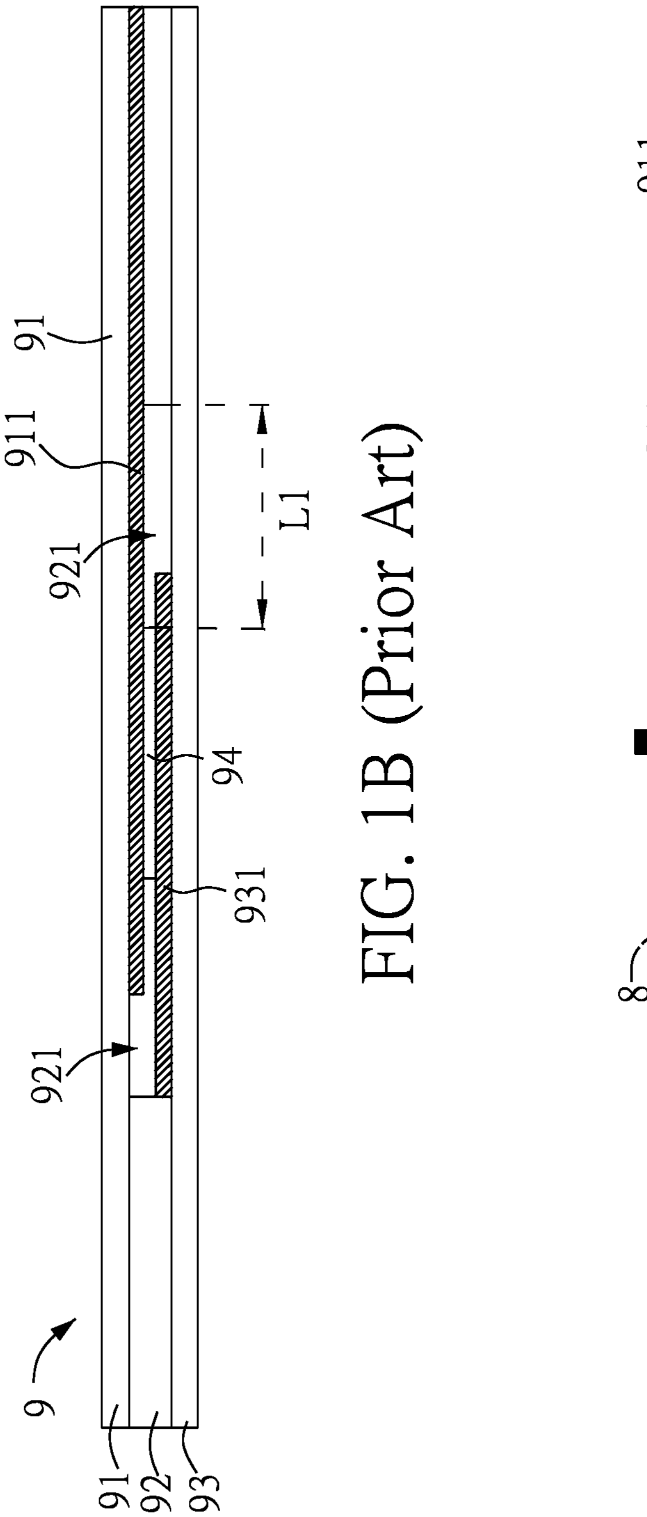
FIG. 1B is a sectional schematic view along the A-A side of the membrane circuit board shown in FIG. 1A.

Taking FIG. 1A and FIG. 1B as examples, the distance from one end of the conductive adhesive 94 of the prior art membrane circuit board 9 to the inner wall of the butting opening 921 is defined as length L1. In other words, the length L1 is the sum of the distance from the conductive adhesive 94 to the hot-pressing head 8 and the distance from the hot-pressing head 8 to the inner wall of the butting opening 921. In the case of the membrane circuit board 1 according to the present embodiment, the distance from one end of the conductive adhesive 40, with its edge facing the first stress weakening portion 32, to the inner wall of the butting opening 31 is also approximately length L1, as shown in FIG. 2 and FIG. 5A. That is, the length L1 is the sum of the distance from the conductive adhesive 40 to the hot-pressing head 8 and the distance from the hot-pressing head 8 to the inner wall of the butting opening 31. The space layer 30 of this embodiment has the first stress weakening portion 32 connected to the butting opening 31, thereby increasing the distance from the bottom inner wall 321 of the first stress weakening portion 32 to the butting opening 31, referred to as length L2. It should be noted that the bottom inner wall 321 refers to the inner wall on the side of the first stress weakening portion 32 opposite to the butting opening 31.

Figure 1C:
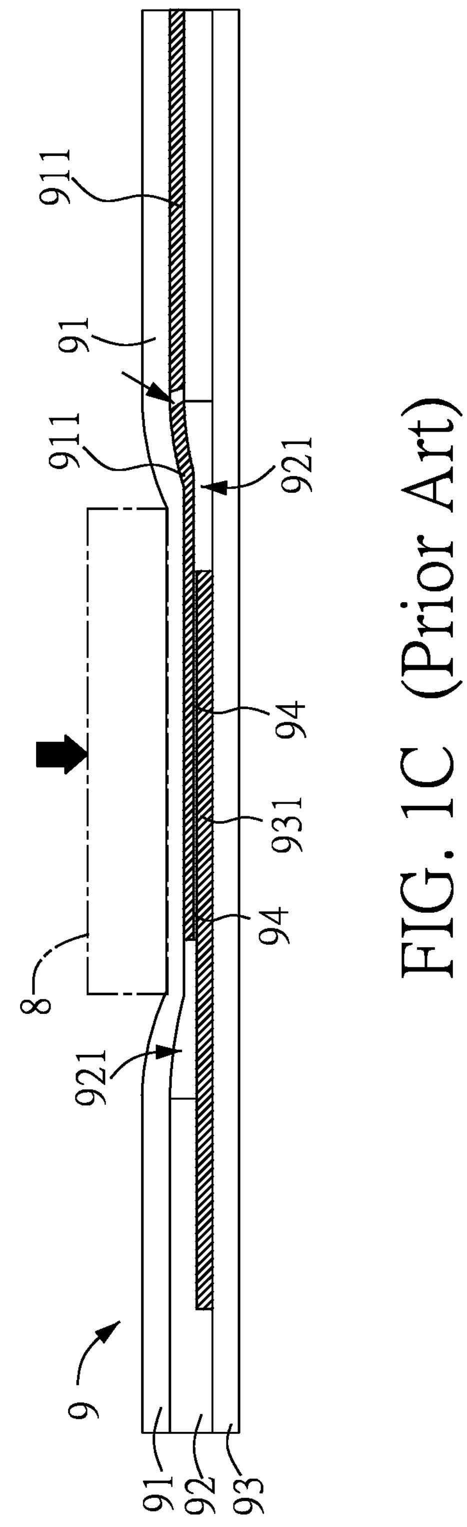
FIG. 1C is a schematic view of the membrane circuit board as shown in FIG. 1B being pressed by a hot-pressing head.

In other words, the distance from one end of the conductive adhesive 40 facing the first stress weakening portion 32 to the bottom inner wall 321 of the first stress weakening portion 32 is the sum of the lengths L1 and L2. Because the first stress weakening portion 32 corresponds to the first transmission circuit 12, when the first substrate 10 is pressed, the slope of the first transmission circuit 12 from the pressure junction with the second butting circuit 21 to the space layer 30 is relatively gentle (as shown in FIG. 6). Conversely, in the prior art, the upper circuit 911 from the pressure junction with the lower circuit 931 to the intermediate space layer 92 is steeper (as shown in FIG. 1C). The first transmission circuit 12 with a smaller slope can reduce the probability of disconnection caused by the mutual shear force between the hot-pressing head 8 and the space layer 30 during pressing.

As shown in FIG. 6, in this embodiment, the position where one edge of the hot-pressing head 8 projects onto the bottom surface of the first transmission circuit 12 is designated as a first projection point 121. It should be noted that because the compression reference region R is the region pressed by the hot-pressing head 8, the edge of the hot-pressing head 8 projected onto the first transmission circuit 12 is substantially equivalent to one end of the compression reference region R toward the first stress weakening portion 32. Furthermore, the position where the bottom inner wall 321 of the first stress weakening portion 32 projects onto the top surface of the first transmission circuit 12 is designated as a second projection point 122. In this embodiment, the slope m of the line connecting the first projection point 121 and the second projection point 122 is less than or equal to 0.0245.

Specifically, in this embodiment, the distance from the edge of the hot-pressing head 8 (i.e., one end of the compression reference region R toward the first stress weakening portion 32) to the bottom inner wall 321 of the first stress weakening portion 32 is designated as length L3. The length L3 is greater than or equal to 1.25 mm. By limiting the length L3 as described above, the slope m between the first projection point 121 and the second projection point 122 can be less than or equal to 0.0245, thereby avoiding the occurrence of fractures in the first transmission circuit 12 due to the shear force generated by the interaction between the hot-pressing head 8 and the space layer 30.

Furthermore, the conductive adhesive 40 of this embodiment is an anisotropic conductive adhesive film (ACF) with a certain thickness. When the conductive adhesive 40 is pressed by the hot-pressing head 8, it tends to overflow.

However, if the conductive adhesive 40 overflows to the outside of the butting opening 31, it may cause abnormality in the membrane circuit board 1, leading to the need for disposal. In this embodiment, the first stress weakening portion 32 is connected to the butting opening 31, so that the first stress weakening portion 32 can accommodate some of the compressed conductive adhesive 40. In other words, the first stress weakening portion 32 can also accommodate the overflow of the conductive adhesive 40.

Figure 7:
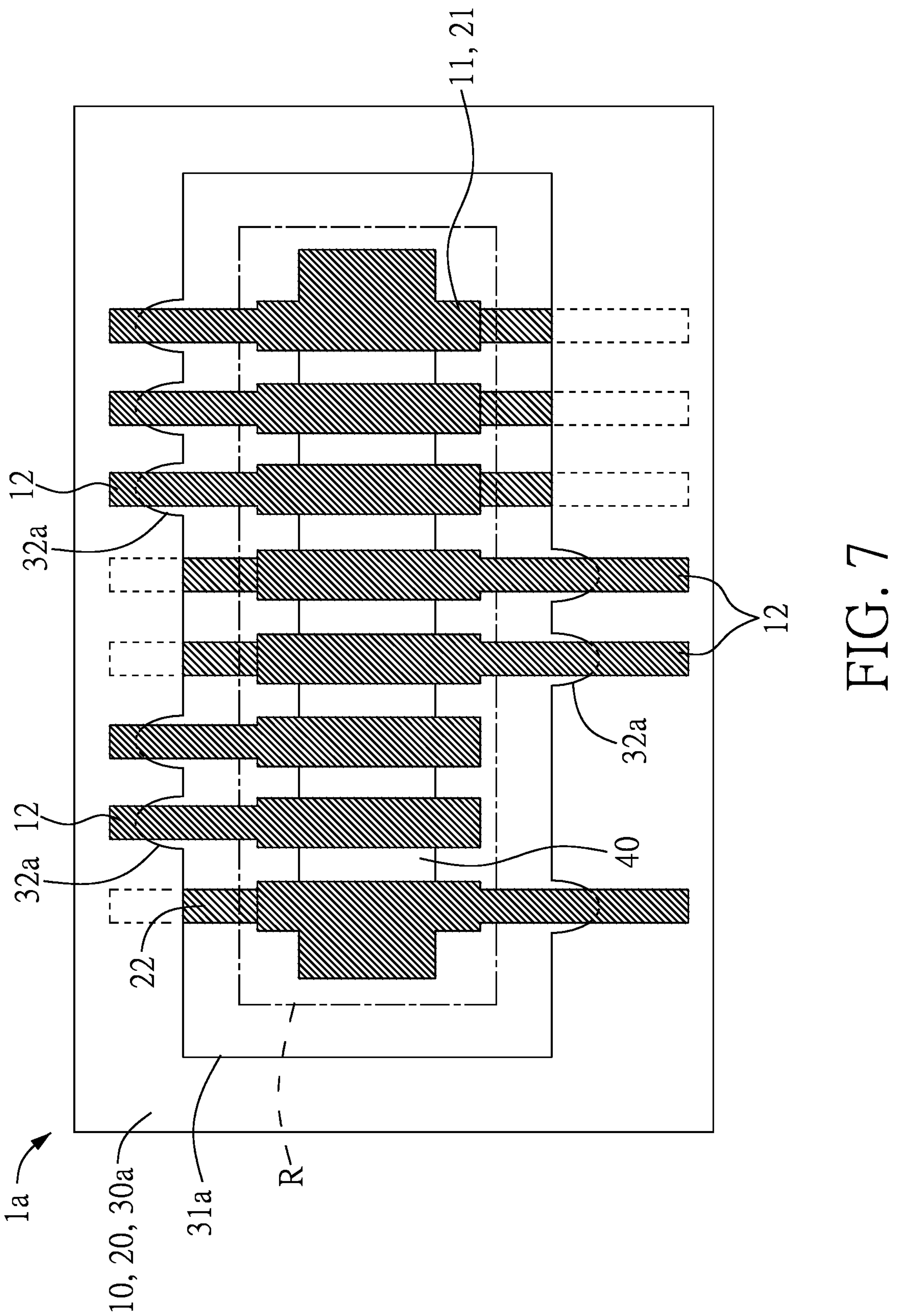
FIG. 7 is a partial top view of a membrane circuit board according to a second embodiment of the present disclosure.

FIG. 7 is a partial top view of the membrane circuit board according to a second embodiment of the present disclosure. Refer to FIG. 7. The membrane circuit board 1*a* of this embodiment differs from the previous embodiment in the space layer 30*a*. Therefore, the structure and connection relationship of other components such as the first substrate 10, the second substrate 20, and the conductive adhesive 40 can be referred to the previous embodiment, and the same reference numerals are used accordingly. Similarly, because the first substrate 10, the second substrate 20, and the space layer 30*a* are stacked in a three-layer structure, they are marked in the same position. In addition, because the first butting circuit 11 and the second butting circuit 21 overlap each other, they are also marked in the same position.

The space layer 30*a* of this embodiment also comprises a butting opening 31*a* and a plurality of first stress weakening portions 32*a*, with one end of each first stress weakening portion 32*a* connected to the butting opening 31*a*. The difference from the previous embodiment is that each first stress weakening portion 32*a* of this embodiment corresponds to each first transmission circuit 12. In other words, one first stress weakening portion 32*a* of this embodiment corresponds to one first transmission circuit 12, so that the distribution area of the first stress weakening portion 32*a* is minimized compared to the first embodiment. This provides advantageous for application in membrane circuit boards 1*a* with a higher density of circuit distribution.

Figure 8:
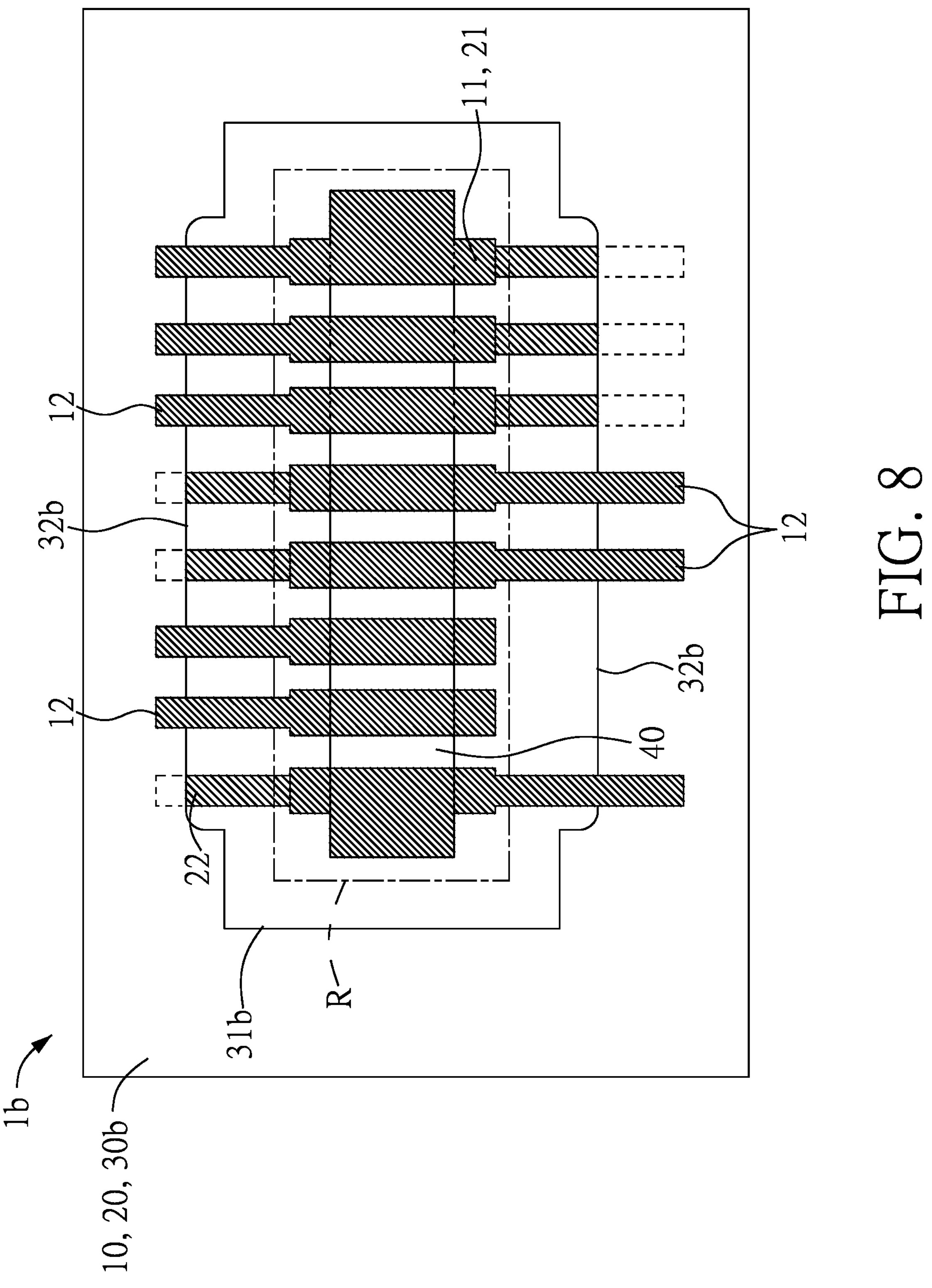
FIG. 8 is a partial top view of a membrane circuit board according to a third embodiment of the present disclosure.

FIG. 8 is a partial top view of the membrane circuit board according to a third embodiment of the present disclosure. Refer to FIG. 8. The difference of the membrane circuit board 1*b* in this embodiment and the previous embodiment also lies in the space layer 30*b*. Thus, the structure and connection relationship of other components such as the first substrate 10, the second substrate 20, and the conductive adhesive 40 can be referred to the previous embodiment, and the same reference numerals are used accordingly. Similarly, the first substrate 10, the second substrate 20, and the space layer 30*b* are marked in the same position, and the first butting circuit 11 and the second butting circuit 21 are also marked in the same position.

The space layer 30*b* of this embodiment also comprises a butting opening 31*b* and a plurality of first stress weakening portions 32*b*, with one end of each first stress weakening portion 32*b* connected to the butting opening 31*b*. The difference from the previous embodiment is that the number of first stress weakening portions 32*b* is two, and they are located on opposite sides of the butting opening 31*b*, corresponding to multiple first transmission circuits 12 located on opposite sides. The distribution area of the first stress weakening portions 32*b* in this embodiment is greater than that of the membrane circuit boards 1 and 1*a* of the first and second embodiments, respectively, and has a better effect of accommodating the overflow of conductive adhesive 40.

Figures 9A, 9B:
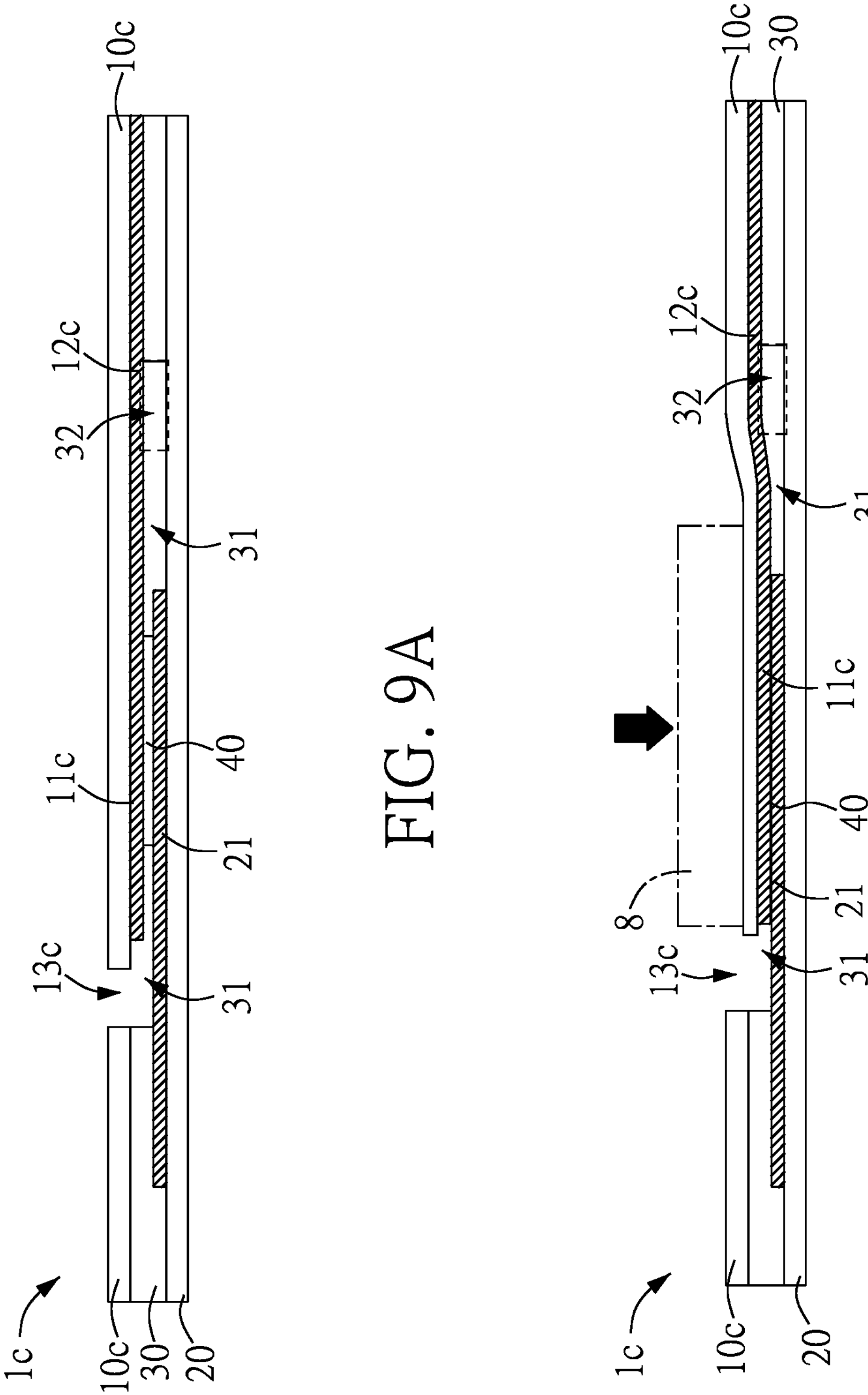
FIG. 9A is a schematic sectional view of a membrane circuit board according to a fourth embodiment of the present disclosure.
FIG. 9B is a schematic view of the membrane circuit board shown in FIG. 9A being pressed by a hot-pressing head.

FIG. 9A is a schematic sectional view of the membrane circuit board according to a fourth embodiment of the present disclosure; and FIG. 9B is a schematic view of the membrane circuit board shown in FIG. 9A being pressed by a hot-pressing head. Refer to FIG. 9A and FIG. 9B. The membrane circuit board 1*c* of this embodiment differs from the first embodiment in the first substrate 10*c*. Thus, the structure and connection relationship of other components such as the second substrate 20, the space layer 30, and the conductive adhesive 40 can be referred to the first embodiment, and the same reference numerals are used accordingly. In this embodiment, the first substrate 10*c* comprises a first butting circuit 11*c*, a first transmission circuit 12*c*, and at least one second stress weakening portion 13*c*. The structure of the first butting circuit 11*c* and the first transmission circuit 12*c* can be referred to the first butting circuit 11 and the first transmission circuit 12 of the previous first embodiment and will not be repeated here. The second stress weakening portion 13*c* is located near one end of the first butting circuit 11*c* opposite to the first transmission circuit 12*c*. In other words, one end of the first butting circuit 11*c* is connected to the first transmission circuit 12*c*, and the other end is close to the second stress weakening portion 13*c*. The second stress weakening portion 13*c* of this embodiment is also a hollow opening structure, forming a swingable free end structure at one end adjacent to the first butting circuit 11*c*.

When the hot-pressing head 8 presses down on the first substrate 10*c*, in addition to the first stress weakening portion 32, the structure of the free end formed by the second stress weakening portion 13*c* can also provide a greater amount of deformation for the first substrate 10*c*. Therefore, the structure of the second stress weakening portion 13*c* can also reduce the probability of the first transmission circuit 12*c* breaking due to the shear force generated by the interaction between the hot-pressing head 8 and the space layer 30 during compression. In brief, the structure of the second stress weakening portion 13*c* can prevent the first transmission circuit 12*c* from breaking due to shear force. In other embodiments, the structure of the second stress weakening portion 13*c* can also be a thinned groove, which can provide a greater amount of deformation for the first substrate 10*c* to prevent the first transmission circuit 12*c* from breaking.

Figure 10:
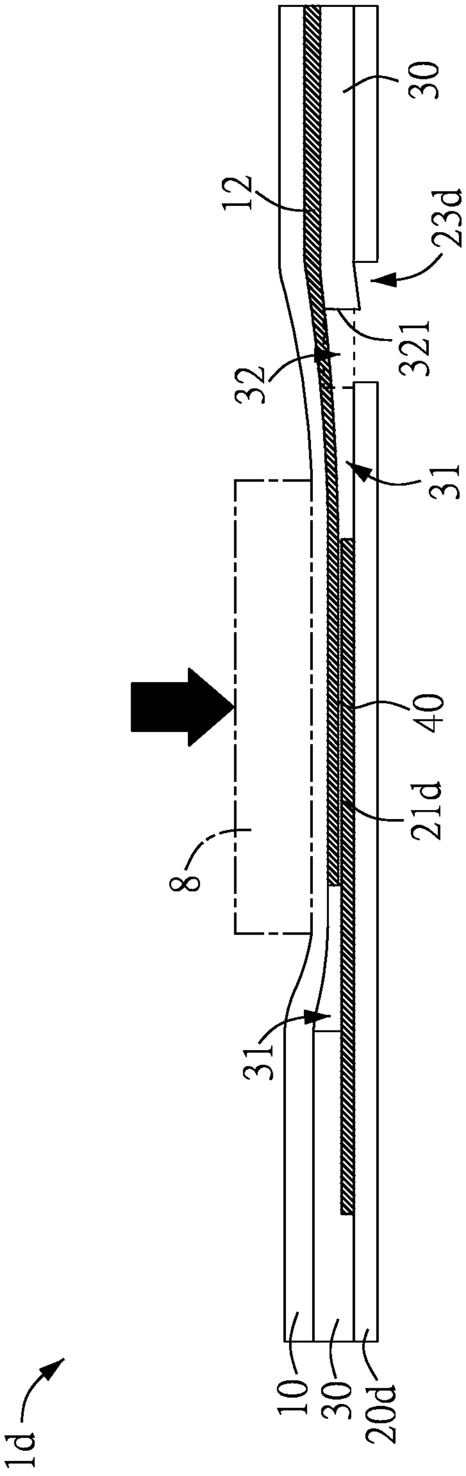
FIG. 10 is a schematic sectional diagram of a membrane circuit board according to a fifth embodiment of the present disclosure.

FIG. 10 is a schematic sectional view of a membrane circuit board of a fifth embodiment of the present disclosure. Refer to FIG. 10. The difference between the membrane circuit board 1*d* of this embodiment and the first embodiment lies in the second substrate 20*d*. Thus, the structure and connection relationship of other components such as the first substrate 10, the space layer 30, and the conductive adhesive 40 can be referred to the first embodiment, and the same reference numerals are used accordingly. In this embodiment, the second substrate 20*d* further includes at least one third stress weakening portion 23*d* corresponding to a portion of the first transmission circuit 12. Specifically, the third stress weakening portion 23*d* is adjacent to one end of the second butting circuit 21*d*, and the upper side of the third stress weakening portion 23*d* corresponds to a portion of the first transmission circuit 12 and a portion of the space layer 30. The structure of the third stress weakening portion 23*d* may be a hollow opening or a thinned groove to reduce the thickness, providing a greater amount of deformation. When the hot-pressing head 8 presses down on the first substrate 10, the portion of the space layer 30 near the bottom inner wall 321 of the first stress weakening portion 32 can move towards the direction of the third stress weakening portion 23*d*, thus avoiding downward movement and preventing the upper first transmission circuit 12 from breaking. Therefore, the structure of the third stress weakening portion 23*d* can also achieve the effect of preventing the first transmission circuit 12 from breaking due to shear force.

As described above, according to the membrane circuit board of the present disclosure, which comprises a first substrate, a second substrate, a space layer, and a conductive adhesive, the space layer is disposed between the first substrate and the second substrate. The conductive adhesive is disposed within the butting opening of the space layer and is in contact with the first butting circuit of the first substrate and the second butting circuit of the second substrate. By having the space layer with a first stress weakening portion, the first substrate with a second stress weakening portion, or the second substrate with a third stress weakening portion, the deformation of the first substrate and its first transmission circuit is enhanced. Therefore, when the hot-pressing head presses down on the first substrate, the structure of the aforementioned (first, second, or third) stress weakening portions increases the deformation of the first transmission circuit, thereby making the pressure on the first transmission circuit more uniform, achieving the effect of avoiding the fracture of the first transmission circuit during the compression process.

Although the present disclosure has been explained in relation to its preferred embodiments, it is to be understood that many other possible modifications and variations can be made without departing from the spirit and scope of the disclosure as hereinafter claimed.

What is claimed is:

1. A membrane circuit board, comprising:

a first substrate comprising a plurality of first butting circuits and at least one first transmission circuit, the first transmission circuit being connected to one of the first butting circuits;

a second substrate comprising a plurality of second butting circuits, each corresponding to one of the first butting circuits;

a space layer disposed between the first substrate and the second substrate, the space layer comprising a butting opening and at least one first stress weakening portion, one end of the first stress weakening portion being connected to the butting opening, and the first stress weakening portion corresponding to the first transmission circuit; and a conductive adhesive disposed within the butting opening, contacting both the first butting circuit and the second butting circuit.

2. The membrane circuit board according to claim 1, further comprising:

a compression reference region distributed within the butting opening, wherein the area of the compression reference region is greater than the area of one surface of the conductive adhesive.

3. The membrane circuit board according to claim 2, wherein one end of the compression reference region is projected to a bottom surface of the first transmission circuit as a first projection point, a bottom inner wall of the first stress weakening portion is projected to a top surface of the first transmission circuit as a second projection point, and the slope of the line connecting the first projection point and the second projection point is less than or equal to 0.0245.

4. The membrane circuit board according to claim 2, wherein the distance from one end of the compression reference region towards the first stress weakening portion to a bottom inner wall of the first stress weakening portion is greater than or equal to 1.25 mm.

5. The membrane circuit board according to claim 1, wherein the first stress weakening portion is an opening extending outward from one end of the butting opening.

6. The membrane circuit board according to claim 1, wherein the first stress weakening portion accommodates a portion of the conductive adhesive that is compressed.

7. The membrane circuit board according to claim 1, wherein the first substrate comprises a plurality of the first transmission circuits, the space layer comprises a plurality of the first stress weakening portions, and each of the first stress weakening portions corresponds to one of the first transmission circuits.

8. The membrane circuit board according to claim 1, wherein the first substrate comprises a plurality of the first transmission circuits, and the first stress weakening portion corresponds to the plurality of first transmission circuits.

9. The membrane circuit board according to claim 1, wherein the first substrate further comprises at least one second stress weakening portion, which is close to one end opposite to the first transmission circuit of the first butting circuits.

10. The membrane circuit board according to claim 9, wherein the second stress weakening portion is an opening structure, creating a free end structure at one end adjacent to the first butting circuits and the second stress weakening portion.

11. The membrane circuit board according to claim 1, wherein the second substrate further comprises at least one third stress weakening portion, adjacent to one end of the second butting circuit and corresponding to a portion of the first transmission circuit.

* * * * *